(12) United States Patent
Yang

(10) Patent No.: US 12,740,473 B2
(45) Date of Patent: Sep. 15, 2026

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventor: Ki Yeul Yang, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 478 days.

(21) Appl. No.: 18/326,850

(22) Filed: May 31, 2023

(65) Prior Publication Data

US 2024/0404908 A1 Dec. 5, 2024

(51) Int. Cl.

*H10W 74/10* (2026.01)
*H10W 70/60* (2026.01)
*H10W 74/01* (2026.01)
*H10W 74/43* (2026.01)
*H10W 74/47* (2026.01)
*H10W 90/00* (2026.01)
*H10W 90/10* (2026.01)

(52) U.S. Cl.

CPC ....... *H10W 74/147* (2026.01); *H10W 74/014* (2026.01); *H10W 74/019* (2026.01); *H10W 74/141* (2026.01); *H10W 90/00* (2026.01); *H10W 70/60* (2026.01); *H10W 74/43* (2026.01); *H10W 74/47* (2026.01); *H10W 74/473* (2026.01); *H10W 90/10* (2026.01)

(58) Field of Classification Search

CPC . H01L 23/3192; H01L 21/561; H01L 21/568; H01L 23/3185; H01L 24/24; H01L 25/0655

See application file for complete search history.

(56) References Cited

U.S. PATENT DOCUMENTS

2017/0207172 A1* 7/2017 Lee ......................... H01L 24/00
2020/0105695 A1* 4/2020 Hu ......................... H01L 24/09
2021/0020605 A1* 1/2021 Hiner .................. H01L 23/3135
2021/0225737 A1* 7/2021 Fang ....................... H01L 24/05
2022/0336337 A1* 10/2022 Hung .................... H01L 21/486
2023/0037713 A1* 2/2023 Chu ........................ H10F 77/50
2023/0420373 A1* 12/2023 Duong ................ H01L 23/3121

* cited by examiner

*Primary Examiner* — Tracie Y Green
(74) *Attorney, Agent, or Firm* — KW Law, LLP

(57) ABSTRACT

In one example, an electronic device can include a first electronic component and a second electronic component adjacent the first electronic component. A buffer block can be disposed between the first electronic component and the second electronic component. An encapsulant can be disposed on the first electronic component, the second electronic component, and the buffer block. A side of the buffer block can be substantially flat and coplanar with a side of the encapsulant. A redistribution structure can be disposed over the side of the encapsulant and the side of the buffer block. Other examples and related methods are also disclosed herein.

20 Claims, 10 Drawing Sheets

18
13
131
121
12

18
13
131
141
121
12

18
13
131
14
21
121
12

18
13
131
15
14
121
12

18
15
13
131
15
14
121
12

SEMICONDUCTOR DEVICES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example, resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figures 1A, 1B, 1C:
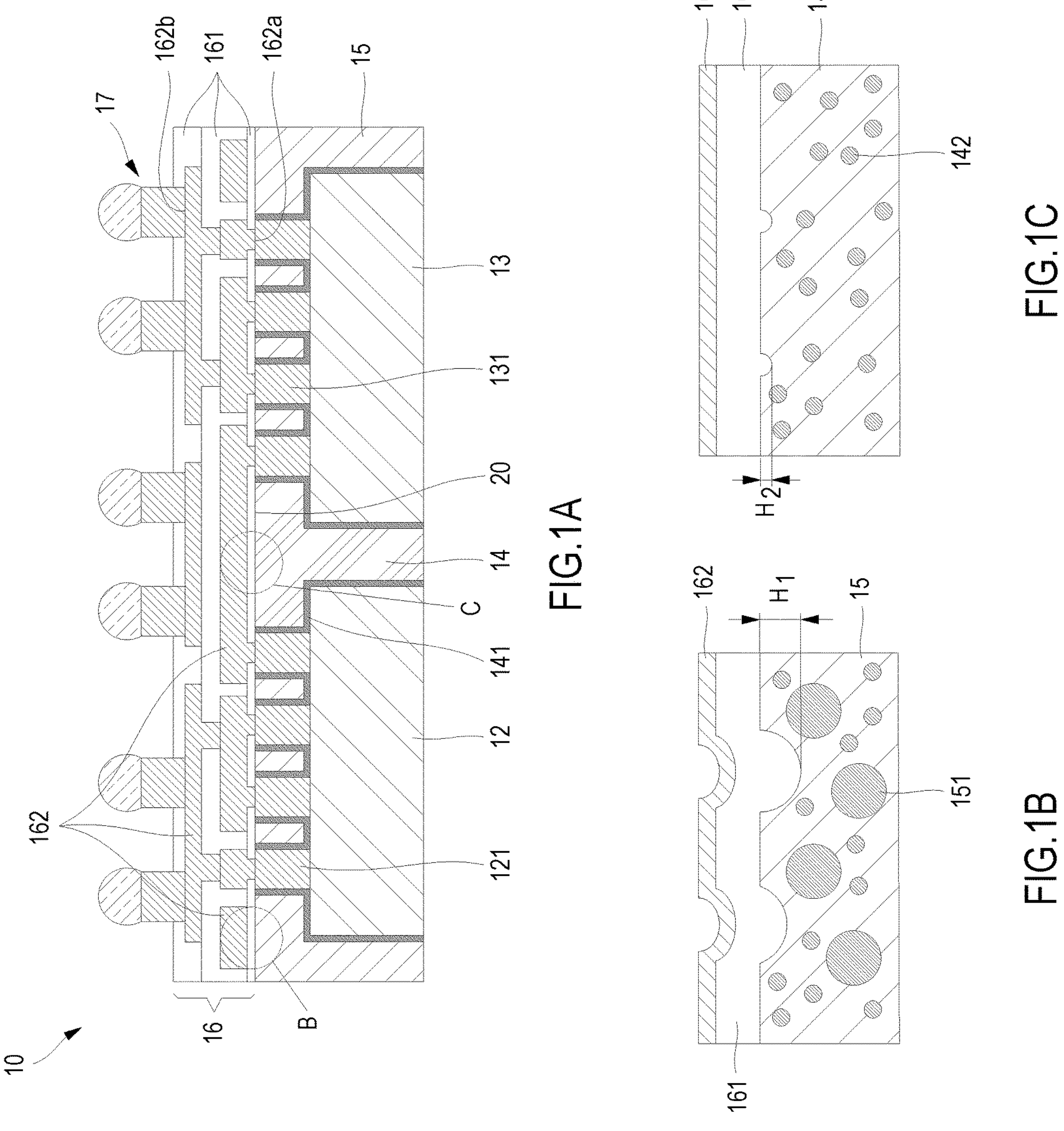
FIG. 1A illustrates a cross-sectional view of an example of an electronic device having a buffer block between dies.
FIG. 1B illustrates a detailed view of an example conductive structure from FIG. 1A disposed over an encapsulant.
FIG. 1C illustrates a detailed view of an example conductive structure from FIG. 1A disposed over a buffer block.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

An example of an electronic device can include a first electronic component and a second electronic component adjacent the first electronic component. A buffer block can be disposed between the first electronic component and the second electronic component. An encapsulant can be disposed on the first electronic component, the second electronic component, and the buffer block. A side of the buffer block can be substantially flat and coplanar with a side of the encapsulant. A redistribution structure can be disposed over the side of the encapsulant and the side of the buffer block.

In various examples, the encapsulant can include a first dielectric material and the buffer block can include a second dielectric material different from the first dielectric material. A filler of the second dielectric material can have a smaller size than a filler of the first dielectric material. A surface defined by the side of the buffer block and the side of the encapsulant can be substantially flat. A liner layer can be disposed between the first electronic component and the buffer block. The buffer block can be a high flattening dielectric block, a flattening block, a high flattening block, a stress absorbing block, or a stress relieving block. The buffer block can include SiO2, SiN, or Al2O3. The buffer block can comprise an epoxy, an acryl, a polyimide, or a polybenzoxazole.

Another example of an electronic device can include an electronic component, a buffer block coupled to the electronic component, and an encapsulant disposed on the electronic component and the buffer block. A first filler material of the encapsulant can have a greater size than a second filler material of the buffer block. A redistribution structure can be disposed on a side defined by the encapsulant and the buffer block. The side can be substantially flat.

Various examples of the electronic device can include a liner layer disposed between the electronic component and the buffer block. A plurality of component interconnects can be disposed on the electronic component with the encapsulant disposed on the component interconnects. The side can be defined by the encapsulant, the buffer block, and a side of a component interconnect from the plurality of component interconnects. The buffer block can contact a component interconnect from the plurality of component interconnects. The buffer block can include SiO2, SiN, or Al2O3.

An example method of making an electronic device can include the step of placing a first electronic component adjacent a second electronic component on a carrier. A buffer block is provided between the first electronic component and the second electronic component. An encapsulant is provided over the first electronic component, the second electronic component, and the buffer block. The buffer block can include a first dielectric material, and the encapsulant can include a second dielectric material different from the first dielectric material. A redistribution structure is provided on a side of the electronic device defined by the encapsulant and the buffer block.

In various examples, the first dielectric material can include a filler material having a smaller size than a filler material of the encapsulant. A liner layer can be provided over the first electronic component and the second electronic component. The buffer block can be disposed over the liner layer, the first electronic component, and the second electronic component. A component interconnect can be provided over the first electronic component. The encapsulant can be disposed over the component interconnect. The encapsulant, buffer block, and component interconnect can be grinded to form the side of the electronic device.

Other examples are included in the present disclosure. Such examples may be found in the figures, in the claims, or in the description of the present disclosure.

Devices and methods of the present disclosure can have improved surface stability for fine-pitched redistribution layer (RDL) formation by using a buffer block disposed between electronic components. Previous electronic devices could have an uneven or wavy surface beneath the RDL, which could result in unstable fine-pitched RDL. Electronic devices of the present disclosure include a buffer block disposed between electronic components, which tends to result in a substantially flat side during formation of an electronic device. The substantially flat side with improved surface morphology can be suitable for placement of a stable, fine-pitched RDL.

FIGS. 1A through 1C show a cross-sectional view of an example electronic device 10 shown with buffer block 14 between electronic component 12 and electronic component 13. In the example of FIG. 1A, electronic device 10 includes electronic component 12, electronic component 13, buffer block 14, encapsulant 15, redistribution structure 16, and external interconnects 17.

In some examples, electronic component 12 can include component interconnects 121 disposed over an active side. Electronic component 13 can include component interconnects 131 disposed over an active side. Liner layer 141 can be disposed between buffer block 14 and electronic component 12, between buffer block 14 and electronic component 13, or between buffer block 14 and component interconnects 131. Liner layer 141 can be disposed between component interconnects 131 and encapsulant 15.

Some examples can include redistribution structure 16 disposed over top side 20 of buffer block 14 in electrical device 10. Redistribution structure 16 can comprise dielectric structure 161 and conductive structure 162. Conductive structures 162 can comprise redistribution internal terminals **162*a* and redistribution external terminals 162*b*. Top side 20 of buffer block 14 can be coplanar with a top side of encapsulant 15 or of component interconnects 121 and 131. A substantially flat surface of electronic device 10 can include top side 20 of buffer block 14 and the top sides of encapsulant 15 and component interconnects 121 or 131**.

FIG. 1B shows a detailed view of electrical device 10 in area B of FIG. 1A. In the example of FIG. 1B, filler 151 can be provided in encapsulant 15. Dielectric structure 161 can be provided over encapsulant 15, and conductive structure 162 (e.g., a trace) can be provided over dielectric structure 161. Filler 151 can have a diameter under about 200 μm. Filler 151 can be removed from encapsulant 15 during grinding and can leave behind depressions in the surface of encapsulant 15. Surface variations in encapsulant 15 can manifest similar surface variations in dielectric structure 161 or conductive structure 162 formed on or provided on encapsulant 15. The surface variations can be created when filler 151 is removed from encapsulant 15 during grinding.

Examples of encapsulant 15 can have a surface with variations in height up to height $H_1$. In the example of FIG. 1B, height $H_1$ can be about 100 μm. Height $H_1$ can be greater than about 50 μm, about 75 μm, or about 100 μm. Height $H_1$ can also be the maximum void size or maximum depression size in the surface of encapsulant 15. Examples of traces or conductive structures 162 formed over encapsulant 15 can have a maximum dip or height variation of about 5 μm. Conductive structures 162 formed over encapsulant 15 can have a thickness ranging from about 3 μm to about 10 μm, pitch or spacing under about 1 mm, and width under about 1 mm.

FIG. 1C shows a detailed view of electrical device 10 in area C of FIG. 1A. Filler 142 in buffer block 14 can be smaller in size than filler 151 in encapsulant 15. Filler 142 can have a diameter under about 20 μm. Filler 142 can be omitted in filler-free examples of buffer block 14. Traces or conductive structures 162 formed over buffer block 14 can have a maximum dip or a maximum height variation of height $H_2$. In the example of FIG. 1C, height $H_2$ can be less than about 10 μm. Height $H_2$ can also be described as the maximum void size or maximum depression size in the surface of buffer block 14.

Examples of traces or conductive structures 162 formed over buffer block 14 can have a maximum dip or height variation of about 2 μm, of about 1 μm, or of about 0.5 μm. An organic chemical mechanical polishing (CMP) process can be used in some examples to control surface variations in buffer block 14 within about 0.5 μm. Conductive structures 162 formed over buffer block 14 can have a thickness ranging from about 3 μm to about 10 μm. Conductive structures 162 formed over buffer block 14 can have pitch or spacing under about 50 μm. Conductive structures 162 formed over buffer block 14 can have width under about 1 μm, about 3 μm, about 5 μm, or about 10 μm. In some examples, the width of conductive structures 162 formed over buffer block 14 can range from about 1 μm to about 10 μm.

In some examples, the surface of buffer block 14 can be flatter than the surface of encapsulant 15. Surface variations of encapsulant 15 can have height $H_2$ greater than the height $H_1$ of surface variations of buffer block 14. Traces on the surface of buffer block 14 can be flatter than traces on the surface of encapsulant 15. Height $H_2$ can be less than about 5 μm, about 10 μm, about 15 μm, or about 20 μm. Height $H_2$ of surface variations in buffer block 14 can be less than height $H_1$ of surface variations on encapsulant 15.

Encapsulant 15, redistribution structure 16, and external interconnects 17 can be referred to as an electronic package such as a semiconductor package, a semiconductor device, or electronic device 10. The package or device can protect electronic components 12 and 13 from external elements or external exposure.

Figure 2A:
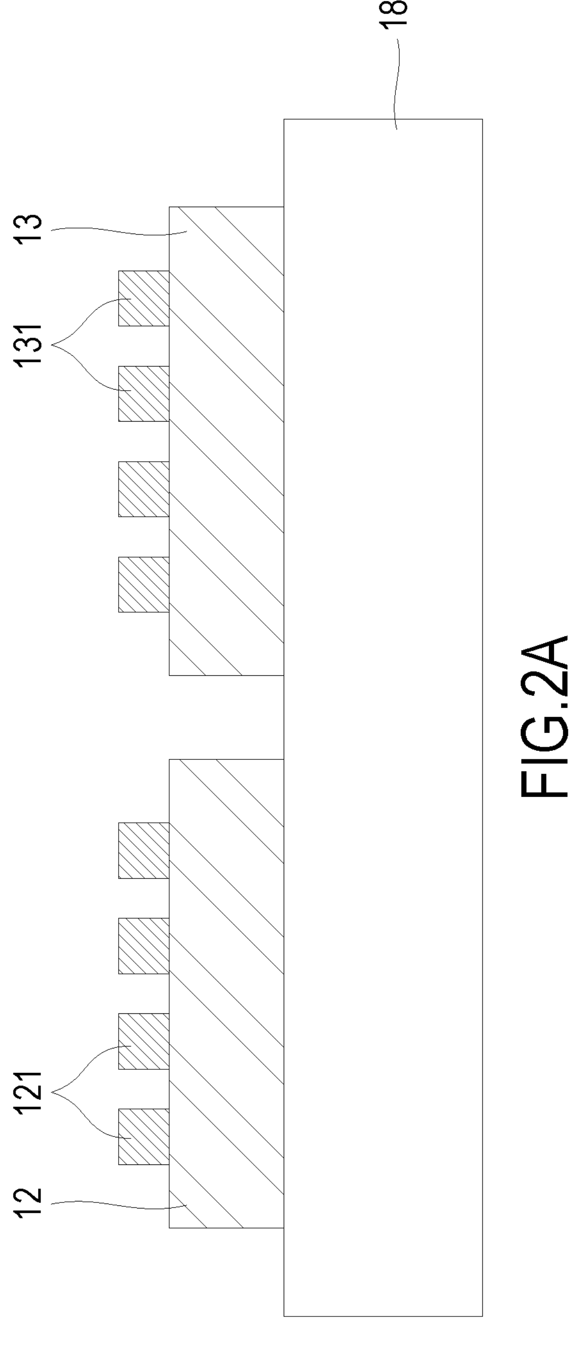
FIGS. 2A to 2J illustrate an example of a method for manufacturing an electronic device having a buffer block between electronic components.

With reference to FIGS. 2A to 2J, an example method is shown for manufacturing electronic device 10 (of FIG. 1). The example of FIG. 2A shows a cross-sectional view of electronic device 10 at an early stage of manufacture. Electronic components 12 and 13 can be provided on support carrier 18. Support carrier 18 can be provided first in some examples. Support carrier 18 can be provided in the form of a circular wafer or a rectangular panel. Support carrier 18 can comprise silicon, glass, ceramic, or metal.

In some examples, electronic components 12 and 13 can be provided on or placed on support carrier 18. Inactive surfaces of electronic components 12 and 13 can face support carrier 18, and active surfaces of electronic components 12 and 13 can face away from support carrier 18. Electronic components 12 and 13 can be removably coupled to support carrier 18 through a temporary bonding agent. Electronic components 12 and 13 can comprise (or be referred to individually as) a semiconductor die, semiconductor chip, or semiconductor package. A die or chip can comprise an integrated circuit die separated from a semiconductor wafer. Electronic components 12 and 13 can comprise a digital signal processor (DSP), network processor, power management unit, audio processor, radio frequency (RF) circuit, wireless baseband system-on-chip (SoC) processor, sensor, or application specific integrated circuit (ASIC). The thickness of electronic components 12 and 13 can range from about 20 micrometers (μm) to about 1000 μm. When used in reference to a distance, the term "about" can mean +/−5%, +/−10%, +/−15%, or +/−20%. Electronic components 12 and 13 can perform a variety of electronic operations including calculation and control processing, storing data, or removing noise from electrical signals, for example.

Various examples of electronic components 12 and 13 can be spaced apart from each other on carrier 18. A distance or gap between a sidewall of electronic component 12 and a side wall of electronic component 13 facing the sidewall of electronic component 12 can range in length from about 5 μm to about 3000 μm, about 10 μm to about 2500 μm, or about 20 μm to about 2000 μm. The adjacent sidewalls of electronic component 12 and electronic component 13 can define an opening or channel between the electronic components 12 and 13.

In some examples, electronic components 12 and 13 can comprise component terminals with component interconnects 121 and 131 protruding from the component terminals. Component interconnects 121 and 131 can comprise or be referred to as pads, pillars, posts, or bumps. The thickness of a component interconnect measured from a surface of the connected electrical component to the distal end of the component interconnect can range from about 1 μm to about 100 μm. A diameter of component interconnects 121 and 131 measured parallel to an adjacent surface of electrical components 12 and 13 can range from about 1 μm to about 100 μm. Component interconnects 121 and 131 can be electrically or mechanically connected to redistribution internal terminals 162*a* (of FIG. 1) of redistribution structure 16 (of FIG. 1) in a subsequent process.

Figures 2B, 2C:
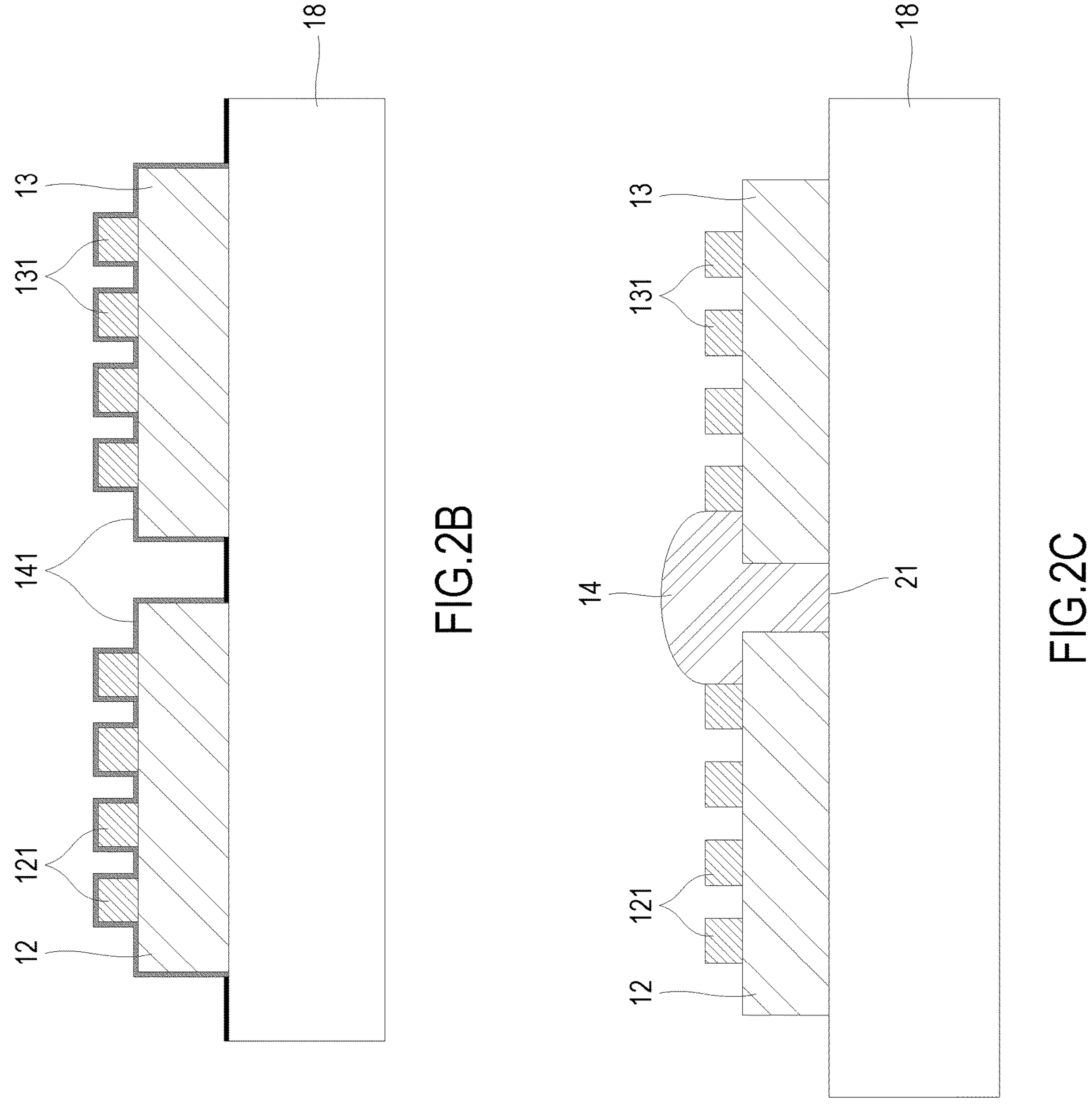

FIG. 2B shows a cross-sectional view of electronic device 10 at a later stage of manufacture. In the example of FIG. 2B, liner layer 141 can be provided on electronic components 12 and 13.

In various examples, liner layer 141 can be provided on the lateral side and the active surface of electronic components 12 and 13. Liner layer 141 can be provided on lateral sides and top sides of component interconnects 121 and 131. Liner layer 141 can be provided only in an area corresponding to buffer block 14 in some examples. Liner layer 141 can comprise or be referred to as an adhesive layer or a buffer layer. Liner layer 141 can be SiO2, SiN, Al2O3, epoxy, acryl, polyimide (PI), polybenzoxazole (PBO), a mold, or a fine filler mold. Liner layer 141 can be provided by a deposition process such as chemical vapor deposition (CVD), physical vapor deposition (PVD), atomic layer deposition (ALD), low pressure chemical vapor deposition (LPCVD), or plasma enhanced chemical vapor deposition (PECVD), a coating process, or a dispensing process. The thickness of liner layer 141 can range from about 1 μm to about 10 μm, from about 2 μm to about 9 μm, from about 3 μm to about 7 μm, or from about 4 μm to about 6 μm. Liner layer 141 can improve adhesion between buffer block 14 and electronic components 12 and 13.

FIG. 2C shows a cross-sectional view of electronic device 10 at a later stage of manufacture. In the example of FIG. 2C, buffer block 14 can be provided on electronic components 12 and 13. Buffer block 14 can be provided in a gap or space between electronic component 12 and electronic component 13. Buffer block 14 can be provided between a sidewall of electronic component 12 and a sidewall of electronic component 13 facing the side wall of electronic component 12.

In some examples, buffer block 14 can partially cover a portion of the active surface of electronic component 12 or a portion of the active surface of electronic component 13. Buffer block can fill a channel or opening defined by adjacent sidewalls of electrical component 12 and electrical component 13. Buffer block 14 can be provided in a gap or space between adjacent sidewalls of a component interconnect 121 and of a component interconnect 131 facing one another. Buffer block can fill a channel or opening defined by adjacent sidewalls of component interconnect 121 and component interconnect 131. The height of liner layer 141 from carrier 18 in the example of FIG. 2C can be greater than the height of component interconnects 121 and 131 from carrier 18.

Various examples of buffer block 14 can comprise or be referred to as a dielectric block, a high flattening dielectric block, a flattening block, a high flattening block, a stress absorbing block, or a stress relieving block. Buffer block 14 can be a ceramic such as SiO2, SiN, or Al2O3. Buffer block 14 can be a polymer such as epoxy, acryl, polyimide (PI), or polybenzoxazole (PBO). Buffer block 14 can be a hybrid material such as an underfill, a mold, or a fine filler mold.

In some examples, buffer block 14 can be provided using a deposition process such as CVD, PVD, ALD, LPCVD, or PECVD. Buffer block 14 can be provided through a coating process or a spraying process. Buffer block 14 can be provided through a dispensing or molding process.

Examples of buffer block 14 can have a thickness ranging from about 30 μm to about 1200 μm, from about 50 μm to about 1000 μm, or from about 100 μm to about 800 μm, with the thickness of buffer block 14 being measured in a perpendicular direction from side 21. Buffer block 14 can have a width ranging from about 5 μm to about 3500 μm, from about 10 μm to about 3000 μm, or from about 15 μm to about 2500 μm.

Figure 2D:
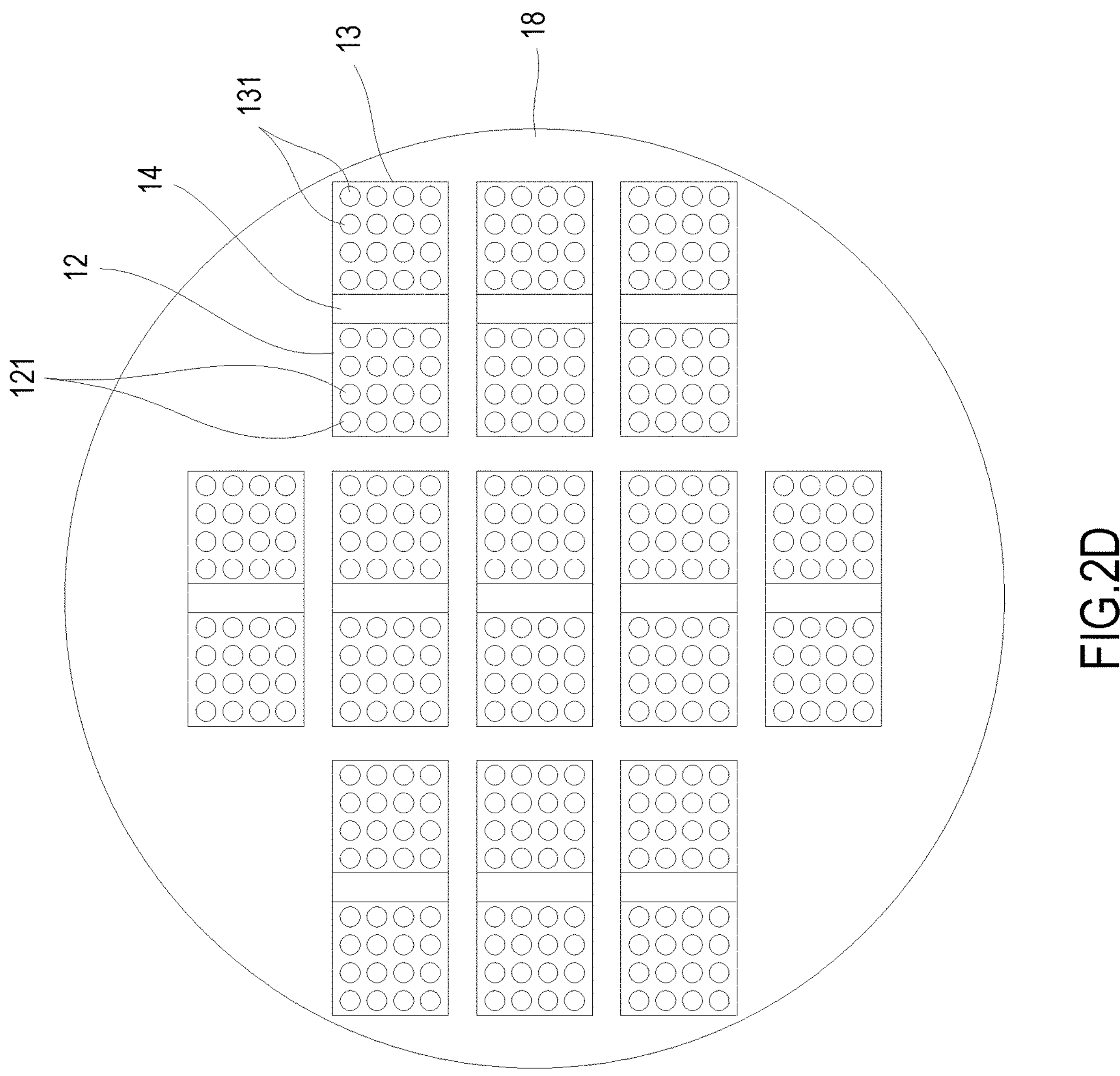

FIG. 2D shows a top view of electronic device 10 at a later stage of manufacture. In the example shown in FIG. 2D, pairs of electronic components 12 and 13 can be provided on support carrier 18 arranged in a grid comprising rows and columns. Pairs of electronic components 12 and 13 can be spaced apart from each other. Similar to the above, buffer block 14 can be provided between electronic components 12 and 13. In some examples, substantially linear buffer block 14 can be provided between electronic components 12 and 13.

Figures 2E, 2F:
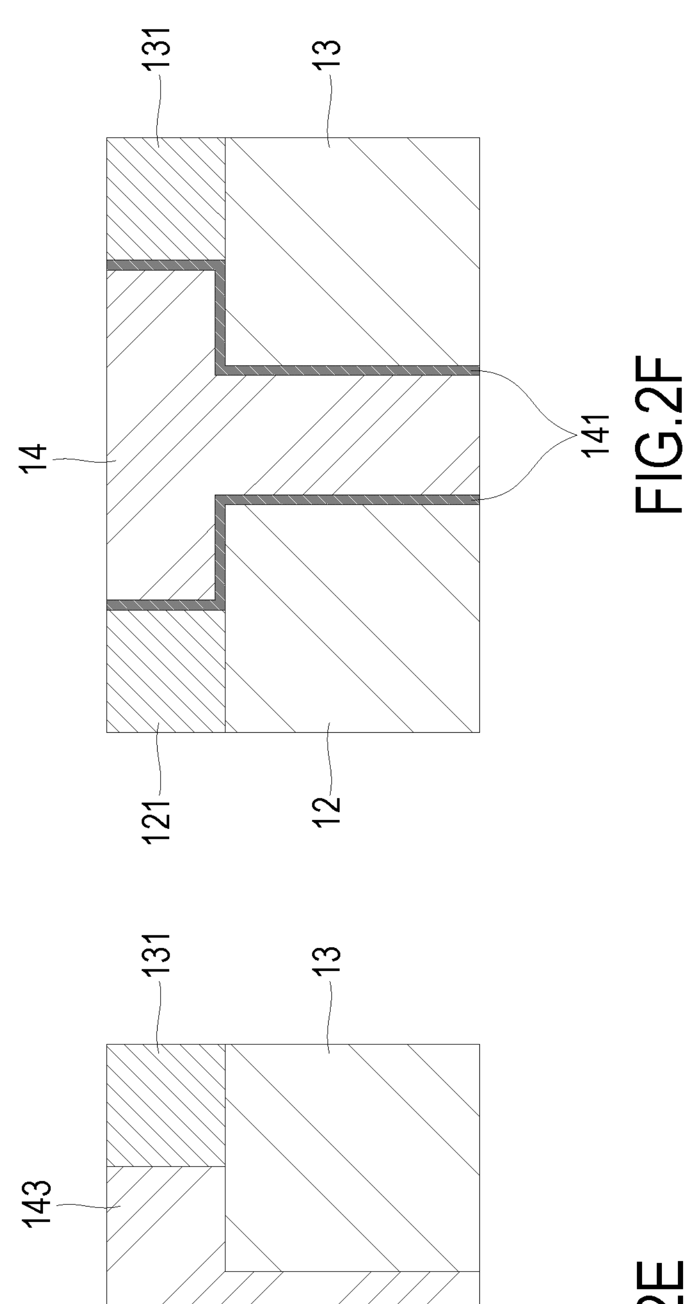

FIG. 2E shows a cross-sectional view of electronic device 10 at a later stage of manufacture. In the example shown in FIG. 2E, buffer block 14 can contact the respective sidewalls of electronic components 12 and 13, some areas of the active surfaces of electronic components 12 and 13, and the respective sidewalls of component interconnects 121 and 131, respectively. Buffer block 14 can have a T-shaped cross section. Portion 143 of buffer block 14 can extend over the active surface of electronic component 12 to component interconnect 121, and portion 143 of buffer block 14 can extend over the active surface of electronic component 13 to component interconnect 131. Top side 20 of buffer block 14 can be coplanar with the exposed surface of component interconnect 121 and the exposed surface of component interconnect 131.

Buffer block 14 tends to improve surface flatness to support reliable, fine-pitched redistribution structures. Buffer block 14 can produce a substantially flat top side 20 or a substantially flat mating surface by attenuating the size of surface deformities sometimes caused by filler material being removed or displaced. When used to describe surfaces or sides, terms such as flat, flatter, or similar terms refer to variations in the height of depressions in a surface. When referring to flatness of a surface, the term "substantially flat" can mean a surface that has variations in surface height of less than about 0.5 μm, about 1 μm, about 1.5 μm, or about 2 μm. The top side of buffer block 14 can exhibit a high degree of flatness (e.g., a low degree of surface height variation or a low degree of roughness).

FIG. 2F shows a cross-sectional view of electronic device 10 at a later stage of manufacture. In the example shown in FIG. 2F, buffer block 14 can contact liner layer 141 located on the respective sidewalls of electronic components 12 and 13, located on some areas of the active surfaces of electronic components 12 and 13, and located on the respective sidewalls of component interconnects 121 and 131. Liner layer 141 can improve bonding between buffer block 14 and electronic components 12 and 13.

Figures 2G, 2H:
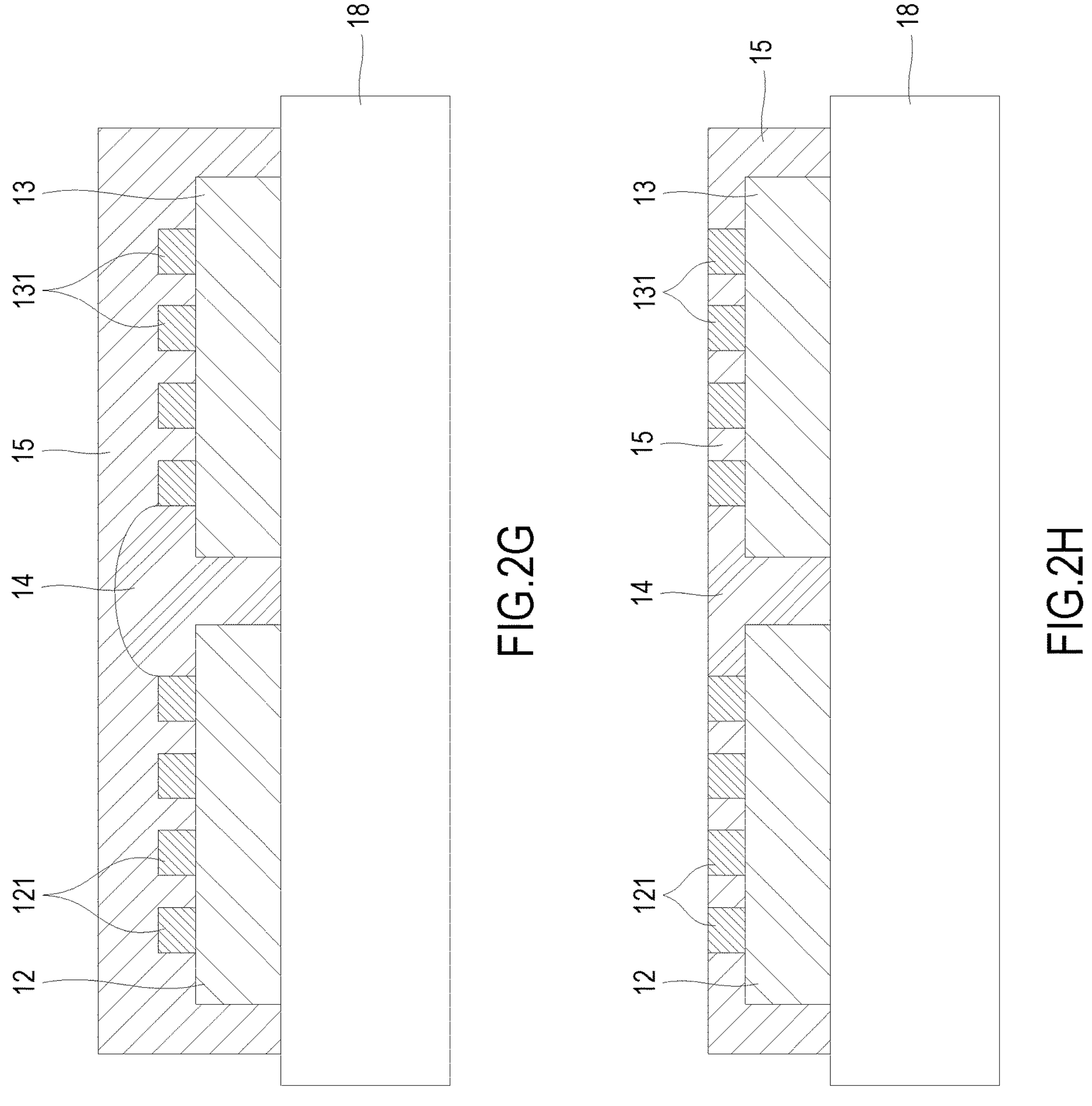

FIG. 2G shows a cross-sectional view of electronic device 10 at a later stage of manufacture. In the example shown in FIG. 2G, encapsulant 15 can be provided on support carrier 18.

Some examples of encapsulant 15 can cover support carrier 18, electronic components 12 and 13, component interconnects 121 and 131, and buffer block 14. Encapsulant 15 can contact support carrier 18, electronic components 12 and 13, component interconnects 121 and 131, and buffer block 14. Encapsulant 15 can also cover or contact liner layer 141 (of FIG. 2B) in examples where liner layer 141 is present. Encapsulant 15 can comprise an epoxy resin or a phenol resin, carbon black, and silica filler. Encapsulant 15 can comprise or be referred to as a mold compound, a resin, a sealant, a filler-reinforced polymer, or an organic body. Encapsulant 15 can be disposed on the lateral sides and top sides of electronic components 12 and 13.

In some examples, encapsulant 15 can be located on the lateral sides and top sides of component interconnects 121 and 131. Encapsulant 15 can be present on the top side of buffer block 14. Encapsulant 15 can be provided by compression molding, transfer molding, liquid encapsulant molding, vacuum lamination, paste printing, or film assist molding. Compression molding can be a process of supplying a fluid resin into a mold in advance and then putting an electronic component into the mold to cure the fluid resin, and transfer molding may be a process of curing by supplying a fluid resin from a gate (supply port) of a mold to the periphery of a corresponding electronic component. The thickness of encapsulant 15 can range from about 100 μm to about 2000 μm. Encapsulant 15 can protect electronic components 12 and 13, component interconnects 121 and 131, and buffer block 14 from external factors or environmental exposure, and some examples of encapsulant 15 can quickly dissipate heat from electronic components 12 and 13.

FIG. 2H shows a cross-sectional view of electronic device 10 at a later stage of manufacture. In the example shown in FIG. 2H, material can be removed to create a top side 20 of buffer block 14 having substantially flat topography. Some examples include a grinding process to partially remove encapsulant 15 and buffer block 14. Some examples can remove a portion of component interconnects 121 and 131.

In some examples, a wafer support system can be attached onto support carrier 18, and then a portion of encapsulant 15 can be removed. A partial area of buffer block 14 can be removed. Buffer block 14 and encapsulant 15 can also be removed by mechanical grinding or chemical etching. Some areas of buffer block 14 and encapsulant 15 can be removed. The wafer support system and the grinder can rotate in opposite directions to remove portions of buffer block 14 and encapsulant 15.

In response to the grinding process or the etching process of some examples, the top sides of component interconnects 121 and 131, the top side of buffer block 14, or the top side of encapsulant 15 can be coplanar. Top side 20 of buffer block 14 can be coplanar with top sides of encapsulant 15, component interconnect 121, and component interconnect 131. In some examples, the top sides of component interconnects 121 and 131, and the top side 20 of buffer block 14 can be exposed through the top side of encapsulant 15. If a liner layer 141 (of FIG. 2B) is present on the top sides of component interconnects 121 and 131, the liner layer 141 can also be removed by the grinding process or the etching process.

In some examples, and in response to the grinding or etching process, top surface 20 of buffer block 14 can be flatter than the top surface of encapsulant 15. In response to the grinding or etching process, the surface roughness of buffer block 14 can be lower than the surface roughness of encapsulant 15. Examples of buffer block 14 lacking an inorganic filler can have low surface roughness since no inorganic filler is removed or displaced from the surface. The surface roughness of encapsulant 15 including an inorganic filler can be increased in response to the inorganic filler leaving depressions after being removed or displaced from the surface during the grinding or etching process. In some examples, the surface roughness of encapsulant 15 can be similar to or equal to the surface roughness of the inorganic filler (e.g., about 100 nanometers (nm) to about 25 μm).

In some examples, buffer block 14 includes a filler material having a smaller size than the filler material of encapsulant 15. Smaller size may refer to a lower volume, a shorter diameter, a smaller sectional area, or other measurements of size suitable for assessing filler material. Some examples of buffer block 14 can be filler free. Filler free can mean that the filler size is zero or that filler is not added to the buffer block. A filler free buffer block 14 has a smaller filler size than encapsulant 15 that includes a filler. Buffer block 14 can have a finer filler material than encapsulant 15. Encapsulant 15 can have a coarser filler material or a larger size than the filler material of buffer block 14. Buffer block 14 tends to have a substantially flat top side 20 in response to the filler having a small size compared to encapsulant 15 or in response to the filler being omitted from buffer block 14.

Figure 2I:
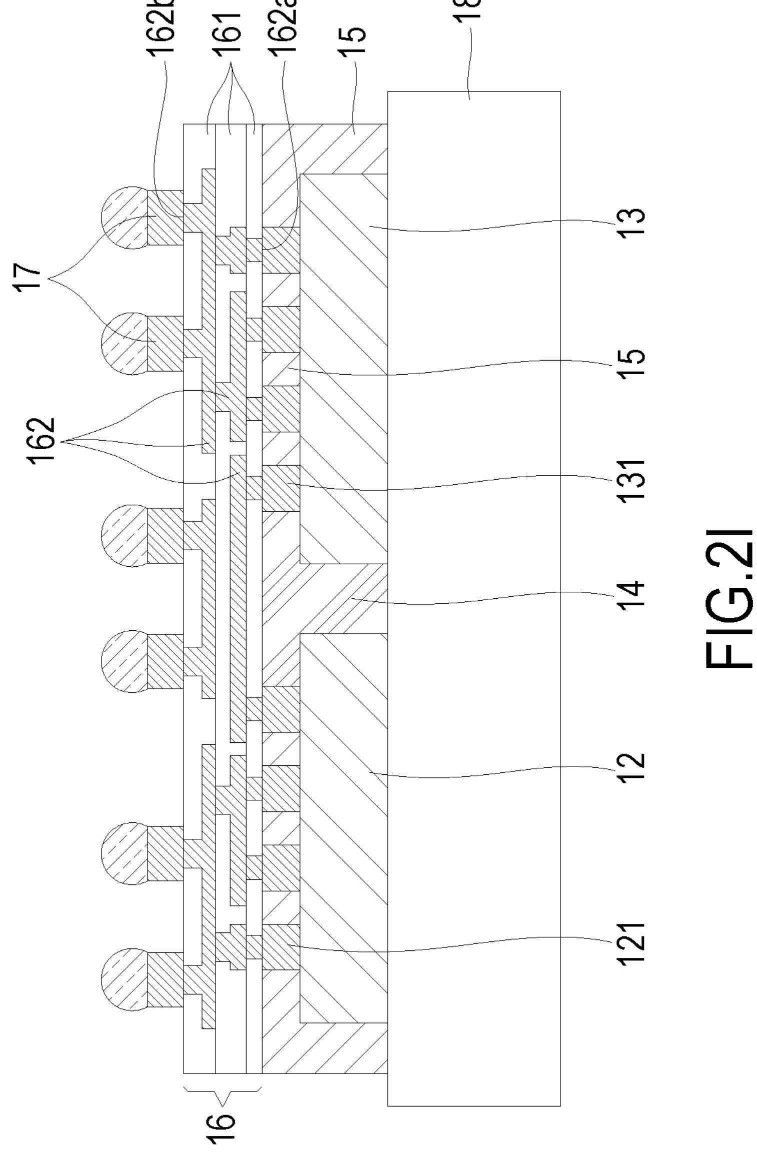

FIG. 2I shows a cross-sectional view of electronic device 10 at a later stage of manufacture. In the example shown in FIG. 2I, redistribution structure 16 can be provided on buffer block 14, encapsulant 15, and component interconnects 121 and 131.

As described above, redistribution structure 16 can comprise dielectric structures 161 and conductive structures 162. In some examples, dielectric structures 161 can be provided on buffer block 14, encapsulant 15, and component interconnects 121 and 131, and conductive structures 162 can then be provided. In some examples, conductive structures 162 can be provided on buffer block 14, encapsulant 15, and component interconnects 121 and 131, and dielectric structures 161 can then be provided. Dielectric structures 161 and conductive structures 162 can have a multilayer structure. Conductive structures 162 can be interleaved between dielectric structures 161. Dielectric structures 161 can be interleaved between conductive structures 162. Dielectric structures 161 can comprise or be referred to as one or more dielectric layers.

In some examples, dielectric structures 161 can be provided by coating or depositing polyimide (PI), benzocyclobutene (BCB), polybenzoxazole (PBO), a resin, or an Ajinomoto build-up film (ABF). Conductive structures 162 can comprise or be referred to as one or more conductive layers, traces, vias, pads, conductive paths, or under bump metals (UBMs). Conductive structures 162 can be provided by plating or depositing copper, a copper alloy, aluminum, an aluminum alloy, gold, a gold alloy, silver, a silver alloy, nickel, a nickel alloy, palladium, a palladium alloy, or tin silver, for example, though other conductive materials can also be used.

As described above, conductive structures 162 can further comprise internal terminals 162*a* and external terminals 162*b*. Internal terminals 162*a* can be electrically connected to traces or vias. Internal terminals 162*a* can comprise or be referred to as two-step pads, pads, or lands. In some examples, the lower sides of internal terminals 162*a* can be coplanar with the lower sides of dielectric structures 161. Internal terminals 162*a* can be electrically and mechanically connected to component interconnects 121 and 131 of electronic components 12 and 13. External terminals 162*b* can also be electrically connected to traces or vias. External terminals 162*b* can comprise or be referred to as pads, lands, UBMs, or studs. The top sides of external terminals 162*b* can be coplanar with the top sides of dielectric structures 161. External terminals 162*b* can protrude from dielectric structures 161. Dielectric structures 161 or conductive structures 162 can be provided by a deposition process such as CVD, PVD, ALD, LPCVD, or PECVD. Dielectric structures 161 or conductive structures 162 can be completed by repeating the above-described deposition (or plating) process, a photo process, or an etching process multiple times.

In some examples, the thickness of dielectric structures 161 and conductive structures 162 can range from about 1 μm to about 10 μm. The total thickness of redistribution structure 16 can range from about 10 μm to about 1000 μm. As such, redistribution structure 16 including dielectric structures 161 and conductive structures 162 can support electronic components 12 and 13. Redistribution structure 16 can also electrically and mechanically connect electronic components 12 and 13 with an external device.

In some examples, since the surface roughness of buffer block 14 can be less than the surface roughness of encapsulant 15, the flatness of redistribution structure 16 provided on buffer block 14 can be greater than the flatness of redistribution structure 16 would be if provided on encapsulant 15 in the location of buffer block 14. The reliability in the fine pitch of redistribution structure 16 disposed on buffer block 14 tends to be higher than the reliability of the fine pitch of redistribution structure 16 would be absent buffer block 14. In some examples, the fine line width of redistribution structure 16 provided on buffer block 14 tends to be more stable than the fine line width would be over encapsulant 15 positioned in the same location of electronic device 10 as buffer block 14. The reliability in the fine pitch of redistribution structure 16 supported on buffer block 14, with respect to the dielectric structure 161 and the conductive structure 162, can be higher than the than the reliability in the fine pitch of redistribution structure 16 would be if provided on encapsulant 15 in the same location as buffer block 14. In some examples, the reliability in the fine line width of redistribution structure 16 provided on buffer block 14 with respect to the dielectric structure 161 and the conductive structure 162 can be more stable than the reliability in the fine line width of redistribution structure 16 would be if provided on encapsulant 15 in the same location as buffer block 14.

In some examples, redistribution structure 16 can be an RDL substrate. RDL substrates can comprise one or more conductive redistribution layers and one or more dielectric layers that (a) can be formed layer by layer over an electronic device to which the RDL substrate is to be coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process.

In some examples, RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask.

In some examples, the dielectric layers of the RDL substrate can be patterned with a photo-patterning process, which can include a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), polybenzoxazole (PBO), resin, or ABF (Ajinomoto Build-up Film). Such dielectric materials can be spun-on or otherwise coated in liquid form, rather than attached as a pre-formed film.

In some examples, to permit proper formation of desired photo-defined features, such photo-definable dielectric materials can omit structural reinforcers or can be filler-free, without strands, weaves, or other particles, which could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s)

can comprise silicon nitride ($Si3N4$), silicon oxide ($SiO2$), and/or SiON. Inorganic dielectric layers can be formed by growing the inorganic dielectric layers using an oxidation or nitridization process instead of using photo-defined organic dielectric materials. Such inorganic dielectric layers can be filler-free, without strands, weaves, or other dissimilar inorganic particles. In some examples, the RDL substrates can omit a permanent core structure or carrier such as, for example, a dielectric material comprising bismaleimide triazine (BT) or FR4, and these types of RDL substrates can be referred to as a coreless substrate.

In some examples, redistribution structure 16 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers, can be attached as a pre-formed film rather than as a liquid, and can include a resin with fillers such as strands, weaves, or other inorganic particles for rigidity or structural support. Since the dielectric layers are non-photo-definable, features such as vias or openings can be formed by using a drill or laser.

In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate omitting the permanent core structure, and the dielectric and conductive layers can be formed on a sacrificial carrier and removed after formation of the dielectric and conductive layers and before attachment to the electronic device. The pre-formed substrate can be referred to as a printed circuit board (PCB) or a laminate substrate. Such pre-formed substrate can be formed through a semi-additive or modified-semi-additive process.

In some examples, external interconnects 17 can be provided on redistribution structure 16. External interconnects 17 can be provided on external terminals 162*b* by a plating process or a deposition process. External interconnects 17 can comprise or be referred to as conductive pillars, conductive balls, conductive bumps, or solder balls. In some examples, by plating or depositing copper, a copper alloy, aluminum, an aluminum alloy, gold, a gold alloy, silver, a silver alloy, nickel, a nickel alloy, or tin silver on external terminals 162*b*, conductive pillars can be provided on external terminals 162*b*. In some examples, flux can be provided on external terminals 162*b*, conductive balls can be dropped on the flux, and conductive balls can then be provided on external terminals 162*b* through a reflow process or a laser assisted bonding process. In some examples, external terminals 162*b* or the conductive balls can comprise tin (Sn), silver (Ag), lead (Pb), copper (Cu), Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. In some examples, the thickness and/or width of external interconnects 17 can range from about 0.01 millimeters (mm) to about 10 mm. External interconnects 17 can serve to connect electronic device 10 mechanically or electrically to an external device.

Figure 2J:
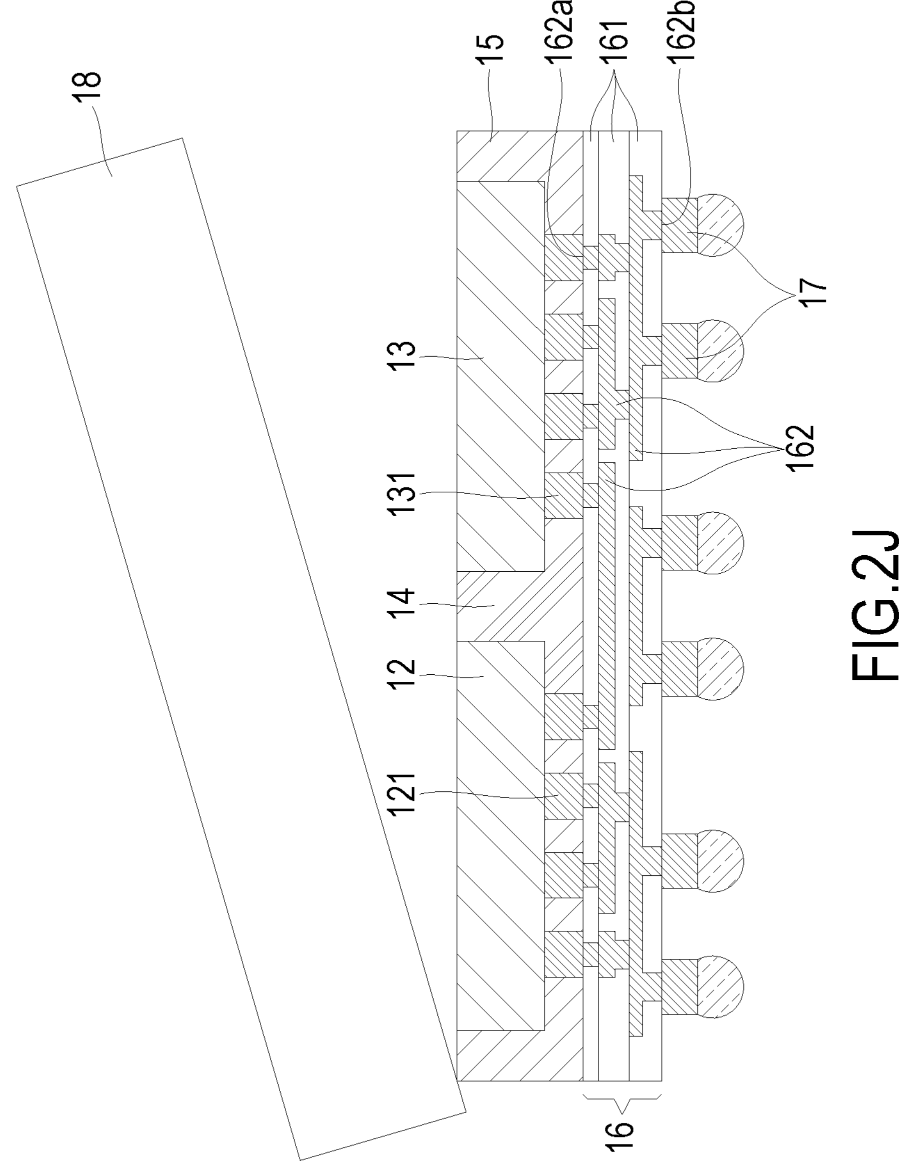

FIG. 2J shows a cross-sectional view of electronic device 10 at a later stage of manufacture. In the example shown in FIG. 2J, support carrier 18 can be removed. A wafer support system can be attached on redistribution structure 16, and support carrier 18 can then be removed. In some examples, when a temporary adhesive film is interposed between the device surface formed by electronic components 12 and 13, buffer block 14, and encapsulant 15, heat or light (e.g., laser beam) can be provided to the temporary adhesive film to reduce the adhesive strength of the temporary adhesive film, and thus, support carrier 18 can be removed from the device surface. Support carrier 18 can be peeled from the device surface by mechanical force. Support carrier 18 can be removed by mechanical grinding and chemical etching. The wafer support system can fix redistribution structure 16 and the grinder can rub and rotate against support carrier 18, thereby removing support carrier 18. The wafer support system and the grinder can rotate in opposite directions to remove carrier 18.

By removing or separating support carrier 18, the device surface can be exposed. In some examples, the surfaces of electronic components 12 and 13 and buffer block 14 can be exposed from encapsulant 15. In some examples, the sides of electronic components 12 and 13, buffer block 14, and encapsulant 15 can be exposed in response to removal of carrier 18 can be coplanar.

In some examples, a thermally conductive lid, a heat spreader, or a heat sink can be attached to exposed electronic components 12 and 13. A thermal interface material (TIM) or back-side metallization (BSM) can be interposed between electronic components 12 and 13 and a lid.

In some examples, a singulation process can be performed. The singulation process can be performed by a cutting wheel or laser beam. When electronic devices 10 are manufactured in a matrix form having rows or columns, electronic devices 10 can be separated into individual electronic devices 10 through a singulation or sawing process. Encapsulant 15 or redistribution structure 16 can be sawed through a cutting wheel. The lateral sides of encapsulant 15 and redistribution structure 16 can be coplanar.

Figure 3:
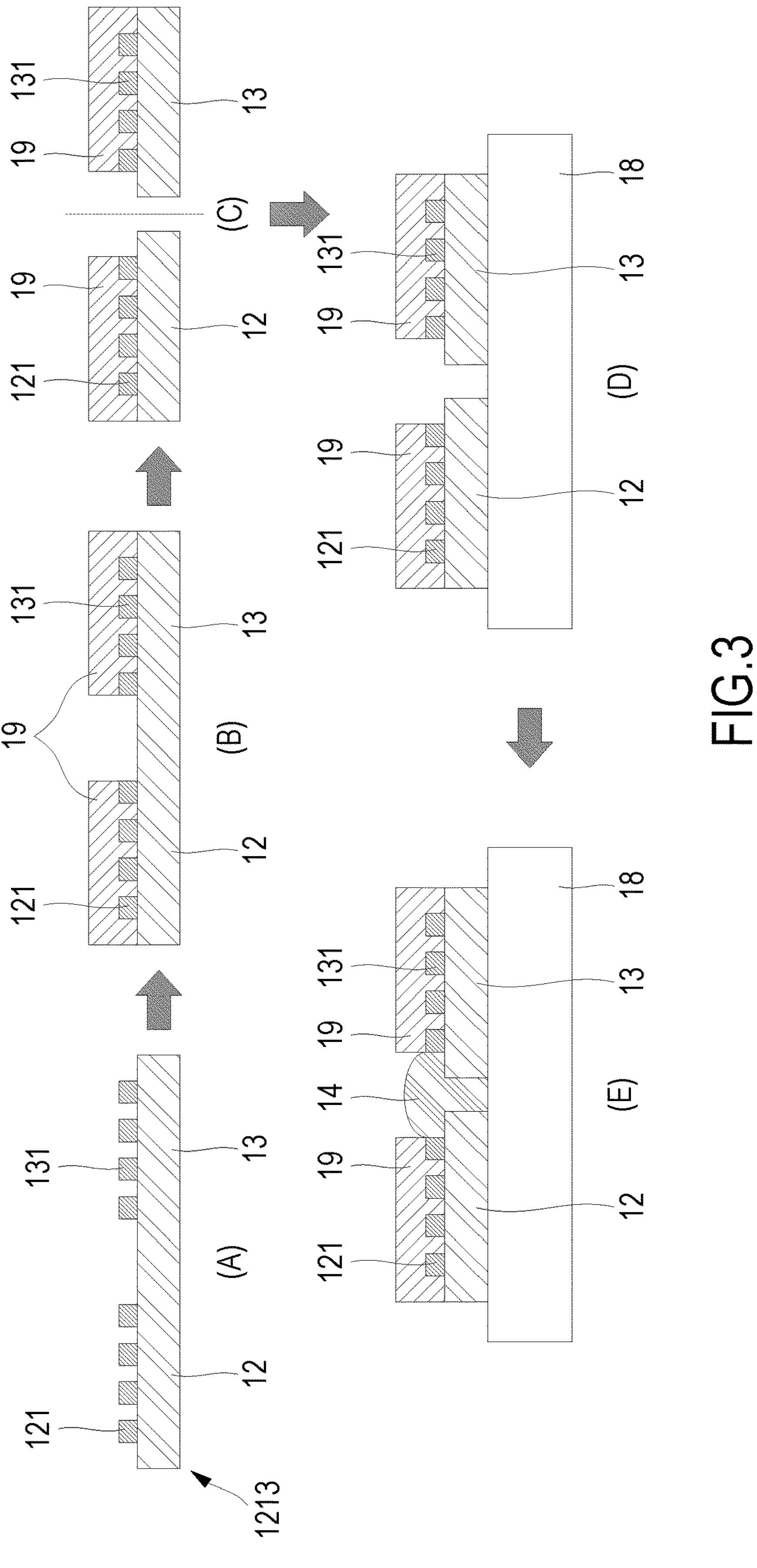
FIG. 3 illustrates an example method for manufacturing an electronic device with a buffer block disposed in an opening defined through a dielectric on a wafer.

FIG. 3 shows an example method for manufacturing an electronic device. In the example shown in FIG. 3, component interconnects 121 and 131 can be provided on device wafer 1213 including electronic components 12 and 13 (Step A), photoresist or film 19 can be provided to cover component interconnects 121 and 131 while exposing portions of electronic components 12 and 13 (Step B), individual electronic components 12 and 13 can be sawed and separated from device wafer 1213 (Step C), separate individual electronic components 12 and 13 can be placed on support carrier 18 while being spaced apart from each other (Step D), and buffer block 14 can be provided in a gap between electronic components 12 and 13 (Step E). Thereafter, photoresist or film 19 can be removed, and the subsequent steps can be similar to those shown in FIGS. 2G to 2J.

In some examples, photoresist can be applied on electronic components 12 and 13 (Step B), a photo mask can then be placed on the photoresist, and an exposure process can be performed followed by a development process, thereby providing film or photoresist 19 covering component interconnects 121 and 131 while selectively exposing some areas of electronic components 12 and 13.

Before device wafer 1213 is sawed, photoresist 19 can cover component interconnects 121 and 131 of electronic components 12 and 13, and buffer block 14 can then be provided in a state where electronic components 12 and 13 covered by photoresist 19 are provided on carrier support 18.

Figure 4:
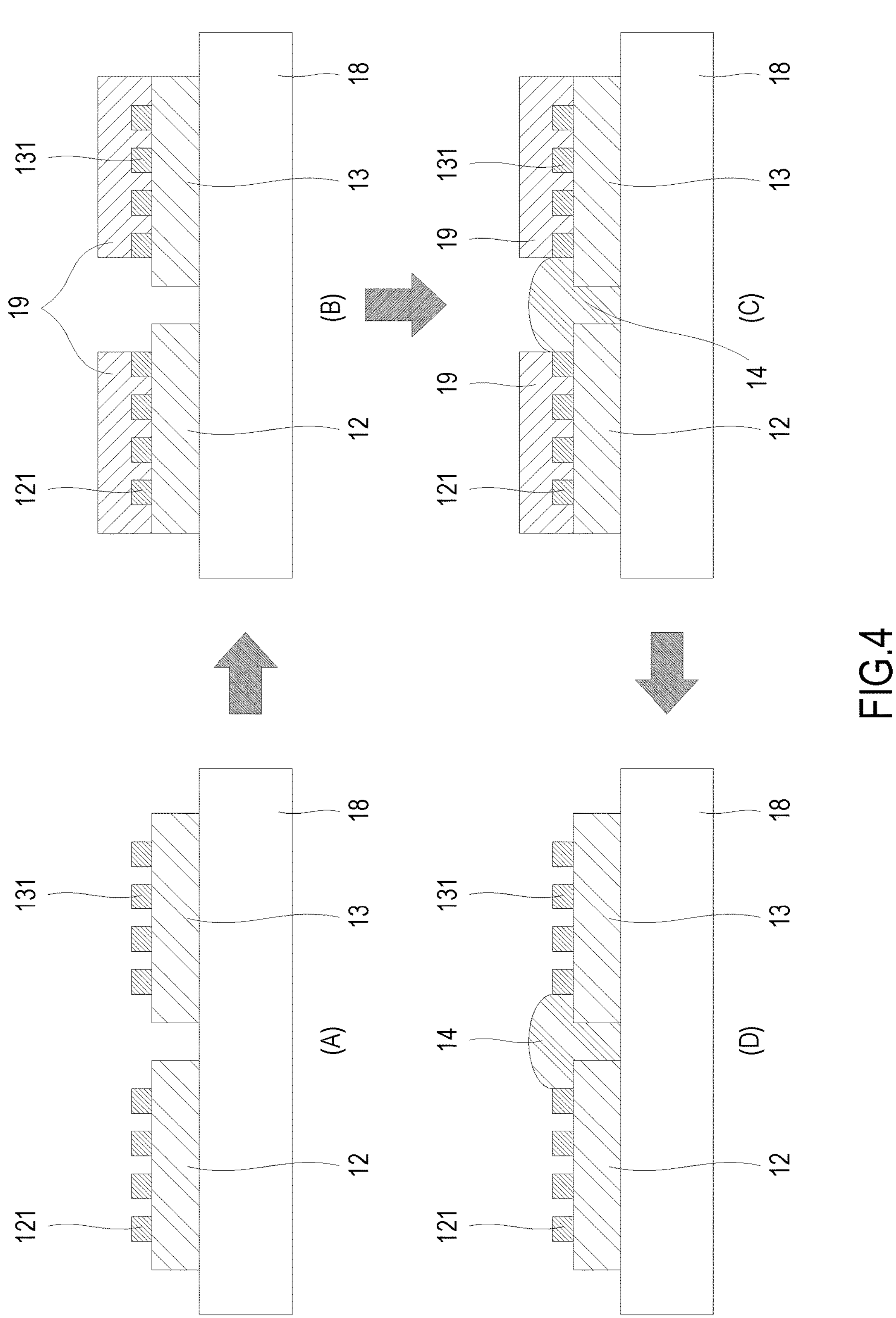
FIG. 4 illustrates an example method for manufacturing an electronic device with a buffer block disposed in an opening defined through a dielectric on adjacent electronic components.

FIG. 4 shows an example method for manufacturing an electronic device. In the example shown in FIG. 4, electronic components 12 and 13 spaced apart from each other can be provided on support carrier 18 (Step A), photoresist or film 19 can be provided on electronic components 12 and 13 to cover component interconnects 121 and 131 while selectively exposing some areas of electronic components 12 and 13 and a partial area of support carrier 18 (Step B), buffer block 14 can be provided between electronic components 12 and 13 (Step C), and photoresist or film 19 can be removed (Step D). The subsequent steps can be similar to those shown in FIGS. 2G to 2J.

In some examples, remaining photoresist 19 can be removed by a liquid resist stripper. The liquid resist stripper can comprise monoethanolamine and 2-butoxy ethanol. Photoresist 19 can be removed by an oxygen-containing plasma. Photoresist 19 can also be removed by a 1-methyl-2-pyrrolidone (NMP) solvent. Once photoresist 19 is dissolved, the solvent can be removed by heating to about 80° C. to evaporate residue. In this way, photoresist 19 can cover component interconnects 121 and 131 of electronic components 12 and 13. Buffer block 14 can then be provided in various examples.

The present disclosure includes reference to certain examples. However, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. An electronic device, comprising:
- a first electronic component;
- a second electronic component adjacent the first electronic component;
- a buffer block disposed between the first electronic component and the second electronic component;
- an encapsulant disposed on the first electronic component, disposed on the second electronic component, and bounding lateral sides of the buffer block over the first electronic component and over the second electronic component, wherein a side of the buffer block is flatter than a side of the encapsulant that is substantially coplanar with the side of the buffer block; and
- a redistribution structure disposed on the side of the encapsulant and the side of the buffer block that is substantially coplanar with the encapsulant.

2. The electronic device of claim 1, wherein the encapsulant comprises a first dielectric material and the buffer block comprises a second dielectric material different from the first dielectric material.

3. The electronic device of claim 2, wherein a filler of the second dielectric material at the side of the buffer block comprises a smaller size than a filler of the first dielectric material at the side of the encapsulant that is substantially coplanar with the side of the buffer block.

4. The electronic device of claim 1, wherein the redistribution structure comprises a trace over the buffer block that is flatter than a trace over the encapsulant.

5. The electronic device of claim 1, further comprising a liner layer disposed between the first electronic component and the buffer block.

6. The electronic device of claim 1, wherein a maximum height of surface variations at the side of the encapsulant is greater than a maximum height of surface variations at the side of the buffer block.

7. The electronic device of claim 1, wherein the buffer block comprises $SiO_2$, SiN, or $Al_2O_3$.

8. The electronic device of claim 1, wherein the buffer block comprises an epoxy, an acryl, a polyimide, or a polybenzoxazole.

9. An electronic device, comprising:
- an electronic component;
- a buffer block coupled to the electronic component;
- an encapsulant disposed on the electronic component and the buffer block, wherein a first filler material of the encapsulant has a greater size than a second filler material of the buffer block, wherein the encapsulant bounds a lateral side of the buffer block over the electronic component; and
- a redistribution structure disposed on a side of the encapsulant and a side of the buffer block, wherein the side of the buffer block is flatter than the side of the encapsulant.

10. The electronic device of claim 9, further comprising a liner layer disposed between the electronic component and the buffer block.

11. The electronic device of claim 9, further comprising:
- a plurality of component interconnects disposed on the electronic component; and
- wherein the encapsulant covers lateral sides of the component interconnects.

12. The electronic device of claim 11, wherein the second filler material has a size of zero.

13. The electronic device of claim 11, wherein the buffer block is coupled to a component interconnect from the plurality of component interconnects.

14. The electronic device of claim 9, wherein the redistribution structure comprises a trace on the buffer block and a trace on the encapsulant, wherein the trace on the buffer block is flatter than the trace on the encapsulant.

15. A method of making an electronic device, comprising:
- placing a first electronic component adjacent a second electronic component on a carrier;
- providing a buffer block between the first electronic component and the second electronic component;
- providing an encapsulant over the first electronic component, the second electronic component, and the buffer block, wherein the buffer block comprises a first dielectric material and the encapsulant comprises a second dielectric material different from the first dielectric material, wherein the encapsulant bounds lateral sides of the buffer block over the first electronic component and over the second electronic component; and
- providing a redistribution structure on a side of the encapsulant and a side of the buffer block.

16. The method of claim 15, wherein the first dielectric material includes a filler material having a smaller size than a filler material of the encapsulant.

17. The method of claim 15, further comprising disposing a liner layer over the first electronic component and the second electronic component.

18. The method of claim 17, wherein the buffer block is disposed over the liner layer, the first electronic component, and the second electronic component.

19. The method of claim 15, further comprising disposing a component interconnect over the first electronic component, wherein the encapsulant is disposed over the component interconnect.

20. The electronic device of claim 1, wherein the buffer block fills a channel defined between a sidewall of the first electronic component and a sidewall of the second electronic component.

* * * * *